(12) United States Patent
Starkell et al.

(10) Patent No.: US 8,217,677 B2
(45) Date of Patent: Jul. 10, 2012

(54) SYSTEM AND METHOD FOR MODULATING A POWER SUPPLY IN A RELAY TEST SYSTEM

(75) Inventors: Jeff Starkell, Mississauga (CA); Scott Gilbertson, Burlington (CA); Kenneth Tang, Mississauga (CA)

(73) Assignee: Manta Test Systems Inc., Mississauga (CA)

( * ) Notice: Subject to any disclaimer, the term of this patent is extended or adjusted under 35 U.S.C. 154(b) by 1062 days.

(21) Appl. No.: 12/138,563

(22) Filed: Jun. 13, 2008

(65) Prior Publication Data

US 2009/0033356 A1    Feb. 5, 2009

Related U.S. Application Data

(60) Provisional application No. 60/952,721, filed on Jul. 30, 2007.

(51) Int. Cl.
*G01R 31/02* (2006.01)

(52) U.S. Cl. .................................. 324/764.01

(58) Field of Classification Search .................. None
See application file for complete search history.

(56) References Cited

U.S. PATENT DOCUMENTS

| 7,415,377 | B2 * | 8/2008 | Klijn et al. | 702/115 |
| 2010/0171552 | A1 * | 7/2010 | French et al. | 330/123 |
| 2011/0267142 | A1 * | 11/2011 | Wismar | 330/129 |

* cited by examiner

*Primary Examiner* — Vinh Nguyen
(74) *Attorney, Agent, or Firm* — Brett J. Slaney; John R. S. Orange; Blake, Cassels & Graydon LLP

(57) ABSTRACT

A system and method are provided for using a class H amplifier in a tester for testing protective relaying equipment, particularly useful in conducting end to end testing. The class H amplifier is configured to provide separation between the amplifier and the power supply of the tester using a DSP which also offers flexibility for programming algorithms to realize efficiencies in matching the waveform to the output rail. End to end testing is also improved by including expected results for the test case used by the tester to enable the tester to determine how close the results are to what is expected. This offers time savings and is less prone to error in that the expected results can be predetermined by a qualified/experienced professional.

12 Claims, 10 Drawing Sheets

SYSTEM AND METHOD FOR MODULATING A POWER SUPPLY IN A RELAY TEST SYSTEM

This application claims priority from U.S. Application No. 60/952,721 filed on Jul. 30, 2007, the contents of which are incorporated herein by reference.

FIELD OF THE INVENTION

The present invention relates generally to electrical power system protection and control, and has particular utility in analyzing end to end test data.

DESCRIPTION OF THE PRIOR ART

Electrical power systems typically make use of protection systems for increasing the reliability of the power system's infrastructure. A common component of such protection systems includes a protective relay, which, in general, monitors the current and voltage at a particular node in the power system, and, if a fault is detected, provides one or more trip signals to trip a circuit breaker in order to isolate a portion of the system. Often, more than one protective relay is needed to completely isolate a portion of the system, which may be a 3-phase power line, a generator, a transformer etc.

Historically, older electromechanical and discrete semiconductor protective relays were tested on a routine basis because they were prone to drift and therefore required periodic testing and calibration to ensure they were working as expected. Modern relays are generally no longer prone to drift and use microcontrollers with built in diagnostics that annunciate failures.

Most relay manufacturers now recommend routine maintenance tests that simply verify that the relay is measuring the basic power system quantities correctly, and that the various output relays that initiate the trip condition are working. This type of testing is more relevant since software is not known to drift or "wear out". The rationale is typically that as long as the basic hardware is sound, repeated routine testing of the same software yields the same results.

Realistically, however, many power utilities continue to test or attempt to test modern relays as if they were prone to the same problems as the older generation of relays. Modern relays now incorporate the features, and therefore tripping action, of many discrete relays, with all elements acting to operate a common trip contact. Testing these relays using conventional techniques becomes difficult because while attempting to test the characteristics of a particular element, other elements often operate.

Accordingly, modern testing of relays has become an exercise in how to minimize the number of times that the settings are altered, and/or to minimize the number of times needed to block an element. This can be not only a waste of time, but may pose a risk in that a relay could potentially be put back in service with incorrect settings or have incorrect functionality.

Some utilities have recognized the apparent futility of routine testing of the relay algorithms. Also, some utilities are beginning to test in a more sensible fashion where the focus is now on verifying correct operation of the protection scheme as a whole instead of the individual relays. The protection scheme typically includes the protective relays, the remote tripping communication equipment, the breaker trip and breaker failure circuits, as well as all interconnection wiring. This type of testing is often referred to as end to end testing.

End to end testing typically requires more sophisticated testing equipment and set up. When performing end to end testing, the response from the relay and auxiliary equipment is dependent both on the nature of the fault simulated, as well as the response from the remote equipment. As such, it may be necessary to generate numerous fault scenarios simultaneously at all ends of the line or element in the circuit to verify correct operation of the protection scheme.

End to End practices vary from utility to utility. In general the following steps are taken: the generation of fault data (the "fault study"); fault data distribution; outage, blocking, and test equipment preparation; coordinated fault playback; analysis of results; and protection restoration.

In most situations, the fault cases are generated using one of the established industry standard power system modeling programs such as Electro Magnetic Transient Program (EMTP), or Computer-Aided Protection Engineering (CAPE). These programs can accurately calculate all the relevant power system quantities for any type of fault regardless of the complexity of the system. This often requires a significant amount of time for entering all of the required data to accurately model a particular portion of the power system. These programs can 2 be considered complex, and are usually only used by a senior protection engineer that is responsible for the overall system. Numerous fault studies may be done to simulate typical "in-and-out-of-zone" fault scenarios.

Once the various fault conditions have been simulated, the fault data is transferred from the simulation computer to the test equipment, which then plays back the scaled down secondary quantities seen by the protective relays. Many utilities store and/or transfer the fault data using the industry standard Common Format for Transient Data Exchange (COMTRADE). Most if not all of the major test-set manufacturers support COMTRADE because it is flexible, scalable, and accommodates non-sinusoidal waveform data. Using COMTRADE does present a few problems. One such problem is that files are often very large, and in some cases incompatible with other vendor equipment due to ongoing changes in the standard. Also, in most cases, the end user is forced to calculate and enter scale factors to scale the data to secondary values.

Some utilities have resorted to a more straightforward method to record and transfer the fault data required for end to end testing. For example, a spreadsheet may be developed for each fault case, which tabulates the data in a simple table showing the amplitude and phase angle for the various stages of the fault. This method has several benefits, such as being intuitive, using industry standard software, having a relatively small file size, and not requiring scaling in the field to name a few. The data in the spreadsheet may then be extracted for or by the test equipment to run the test(s).

A typical line protection scheme may rely on a redundant protection system having two nearly identical protection schemes often referred to as the "A" and "B" protection. Each protection is independent of the other with separate transducers, wiring, power supply (batteries), trip coils in the circuit breaker etc. The "A" and "B" protections often use relays from different manufacturers. In an ideal scenario, the routine protective relay maintenance (protection outage) would occur while the line is out of service for maintenance (line outage), eliminating the possibility of an inadvertent trip. On many lines the ideal situation described above rarely occurs anymore for several reasons such as construction of new transmission lines that would allow line outages is severely limited due to economic (construction costs) and/or environmental (acquisition of new rights-of-way) issues; and the power system and particularly transmission lines are being pushed to the limit, so line outages even if possible from a power transfer perspective, reduce power system stability to an unacceptable level.

One result of such line outage limitations is that protective relay maintenance often needs to be done while the line is in service. This type of testing is inherently more risky because: 1) One of the two protections is temporarily blocked, eliminating the redundant protection; and 2) The trip outputs of the relay being tested is exercised numerous times during the maintenance test, and if a trip signal from the out of service relay is not blocked correctly, the protection outage will quickly become an inadvertent line outage.

Outages are typically scheduled well in advance of the actual outage date. In some cases an approved outage planned a year in advance is cancelled at the last moment due to unexpected demand on the power system due to weather or unanticipated system conditions. Assuming the outage proceeds, the protection technician sets up the test equipment and then isolates the protection by opening the blocking switches connected to the trip outputs of the relay. Next, the current transformer (CT) and potential transformer (PT) signals are isolated from the relay. The output signals from the test set are then connected in place of the now isolated CT and PT signals. Finally, the output signals from the relay are connected to the status inputs of the test set.

At this stage, the technicians on either end of the line set up the test equipment with the agreed upon test case. The two ends then simultaneously (with the help of a timing signal provided by linked global positioning system (GPS) equipment) apply the fault. The various relays operate, or do not operate, depending on the nature of the fault. The actual test is performed most typically in less than one second.

The analysis of the resulting relay operations, targets, etc is then performed to verify that the protection system operated as expected. This step varies from utility to utility, and even within a utility. In the simplest case, the technician simply verifies the correct targets are displayed on the relay and that the basic trip output of the relay operated or did not operate. More sophisticated users will analyze the sequence of events in more detail. However, detailed analysis can be time consuming and, more importantly, such analysis relies on the knowledge and experience of the technicians doing the test, which requires an understanding of how the system is supposed to respond to the particular fault case. Since technicians' skill levels can vary to a large degree, the analysis may be prone to error, or require the input of a more senior person.

When all testing is complete, the test equipment is disconnected, the CT and PT circuits are restored, and then the blocking switches are closed to restore the protection.

In one aspect, it is an object of the following to obviate or mitigate the above-noted disadvantages.

In another aspect, it is an object of the following to provide modulation for a power supply in an amplifier used in testing equipment for testing the above-described protective relays that minimizes power dissipation and noise, while balancing overall weight of the amplifier.

SUMMARY OF THE INVENTION

In one aspect, there is provided a system for modulating a power supply in a relay test system comprising an amplifier, the system comprising a control system separating the power supply and the amplifier and configured to operate according to a class H modulation scheme; an output switching mechanism connected to the control system; a drive intensity signal input into the digital signal processor indicative of the extent to which the output switching mechanism is being operated; and a voltage difference circuit for monitoring a difference between an output of the amplifier and a power supply rail; wherein the class H modulation scheme is operated according to readings taken from the voltage difference circuit and the drive intensity signal.

In another aspect, there is provided a method for performing an end-to-end test on a power system is provided comprising: obtaining a test case comprising end-to-end test parameters and at least one expected result for at least one corresponding test parameter; running the end-to-end test according to the test case; displaying an output indicative of actual results of the end-to-end test; and for the at least one expected result, providing an indicator with the output showing how a corresponding one of the actual results differed from the expected result.

In yet another aspect, there is provided a computer readable medium comprising computer executable instructions for performing the method described above.

BRIEF DESCRIPTION OF THE DRAWINGS

An embodiment of the invention will now be described by way of example only with reference to the appended drawings wherein:

FIG. 8 is a screen shot of a spreadsheet comprising fault test data.

FIG. 9 is a screen shot of the spreadsheet shown in FIG. 8 with predictive result data appended thereto.

DETAILED DESCRIPTION OF THE INVENTION

Figure 1:
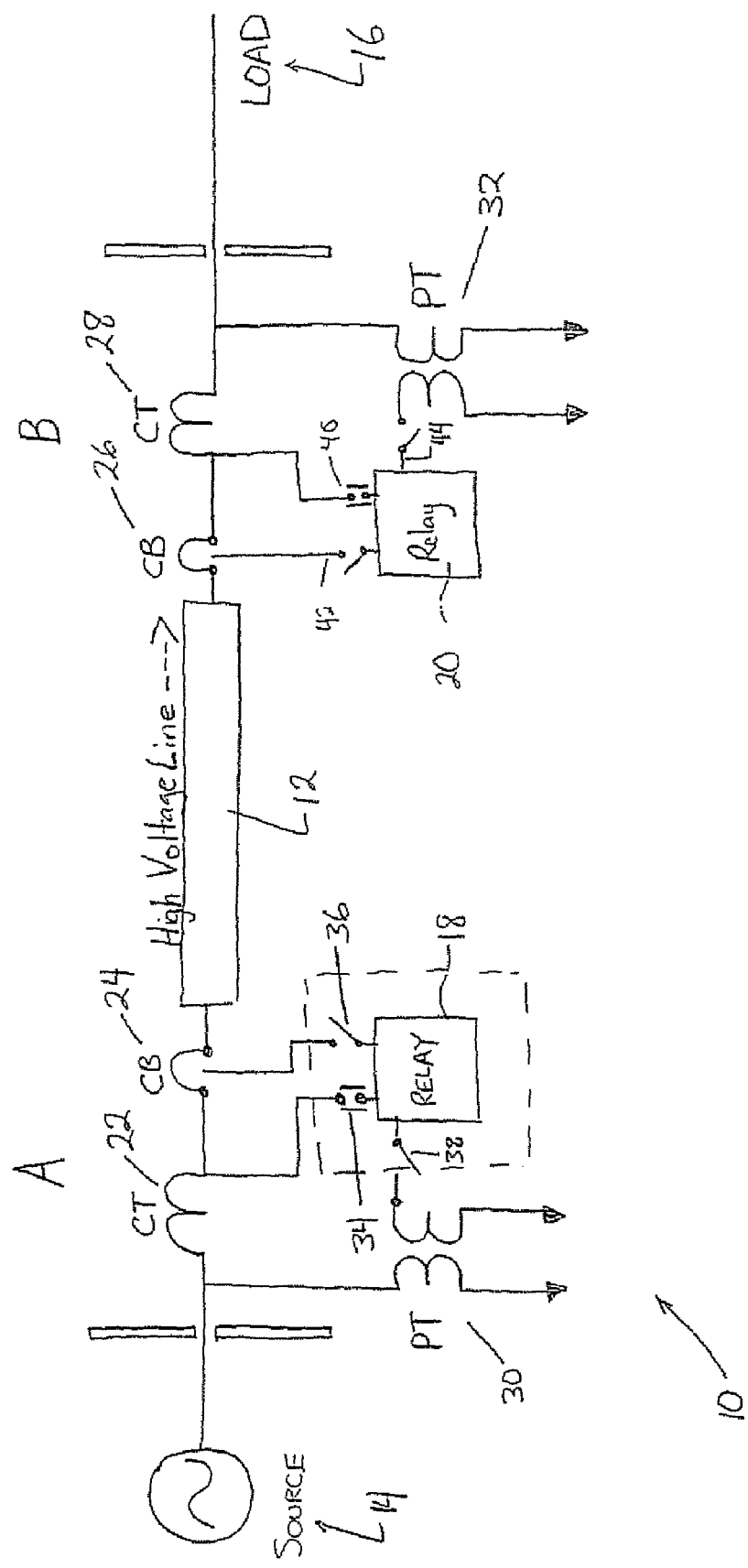
FIG. 1 is a schematic diagram of an end to end testing arrangement for a high voltage power line.

Referring first to FIG. 1, an exemplary protective relay testing arrangement is generally denoted by numeral 10. In this example, a high voltage transmission line 12 between a power source 14 and a load 16 is protected by a first protective relay 18 towards the source end of the line 12 (denoted by "A"), and a second protective relay 20 towards the load end of the line 12 (denoted by "B"). It will be appreciated that the line 12 is shown as a single phase or "1 line" transmission line for clarity only and that the line 12 may be instead (and is typically) a three phase or "3 line" transmission line. It will also be appreciated that the testing arrangement 10 is applicable to any portion of a power system infrastructure such as a generator, transformer etc.

Endpoint A of the testing arrangement 10 comprises an inline current transformer (CT) 22 for measuring current in the line 12, and a circuit breaker 24 for isolating the line 12. Similarly, endpoint B comprises a breaker 26 and CT 28 to complete the isolation. Each end also comprises a potential transformer (PT) 30 and 32 respectively for measuring voltage in the line 20. The first relay 18 at end A is connected to the CT 22 to measure current through push switch 34, is connected to the circuit breaker 36 to provide a trip signal for tripping the breaker 36 through on/off switch 36, and is connected to the PT 30 to measure voltage through on/off switch 38. It will be appreciated that the second relay 20 is connected to the circuit breaker 26, CT 28 and PT 32 in a similar manner, namely through push switch 40, on/off switch 42, and on/off switch 44 respectively.

The protective relays 18, 20 are complex electromechanical apparatus, often having more than one coil, and are designed to calculate operating conditions on the transmission line 12, and trip the circuit breakers 24, 26 when a fault is found. Unlike switching type relays with fixed and usually ill-defined operating voltage thresholds and operating times, the protective relays 18, 20 typically have well-established, selectable, time/current (or other operating parameter) curves. The protective relays 18, 20 are generally important to the reliability of the transmission infrastructure (including transmission line 12) and thus it is important that they are operating correctly.

Figure 2:
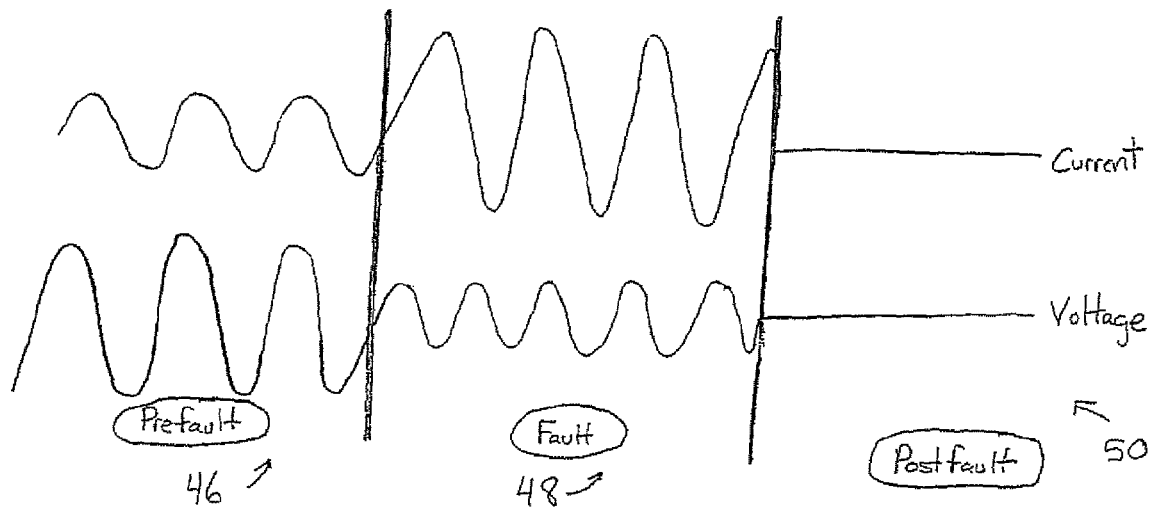
FIG. 2 is a waveform illustrating pre-fault, fault and post-fault current and voltage signals.

FIG. 2 shows voltage and current waveforms in a pre-fault stage 46 where the normal, expected sinusoidal waveforms are shown, during a common fault 48 (e.g. where an obstruction contacts the line 12), where the current rises dramatically as the voltage decreases, until a post fault stage 50 where the protection trips the breakers associated with the faulted section of the line 12 isolating the faulted section and causing the current and voltage to effectively go to zero.

Figure 3:
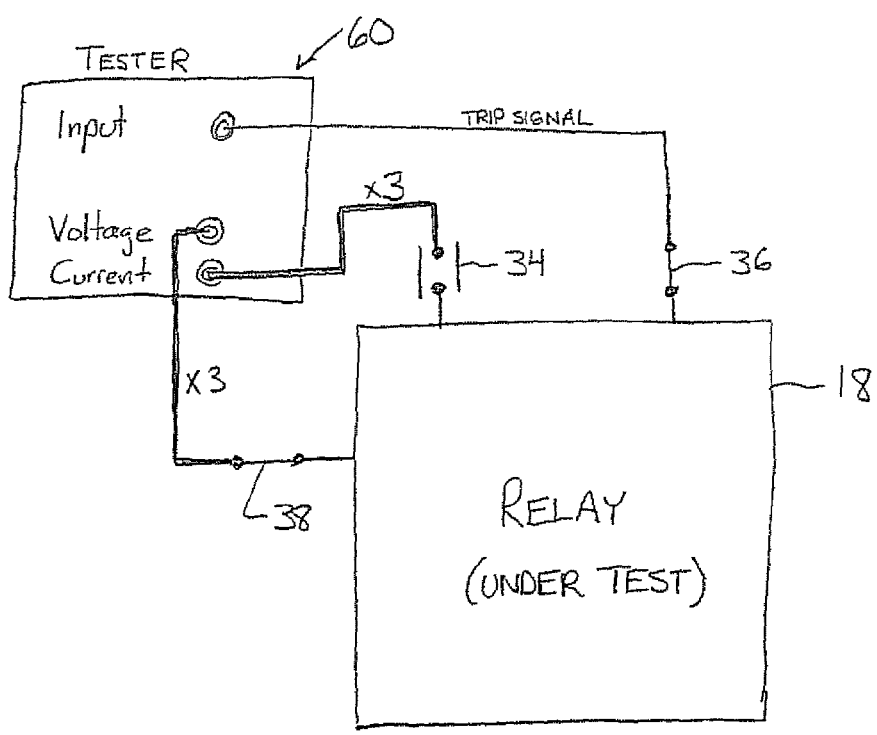
FIG. 3 is a schematic block diagram of a protective relay under test and test equipment therefor.

As discussed above, and shown generally by way of example only in FIG. 3, end to end testing may be accomplished by connecting the protective relay 18, 20 to a protective relay testing system or tester 60. As shown in FIG. 3, a voltage output from the tester 60 is connected to the switch 38, a current output from the tester 60 is connected to switch 34 and the trip signal provided through switch 36 on the relay 18 is connected to an input to the tester 60. It will be appreciated that typically the voltage and current outputs are for three phase circuits and thus such connections would typically include three connections per voltage and three connections per current. The input and voltage and current outputs are shown in general in FIG. 3 and further detail regarding these connections is provided below.

Figure 4:
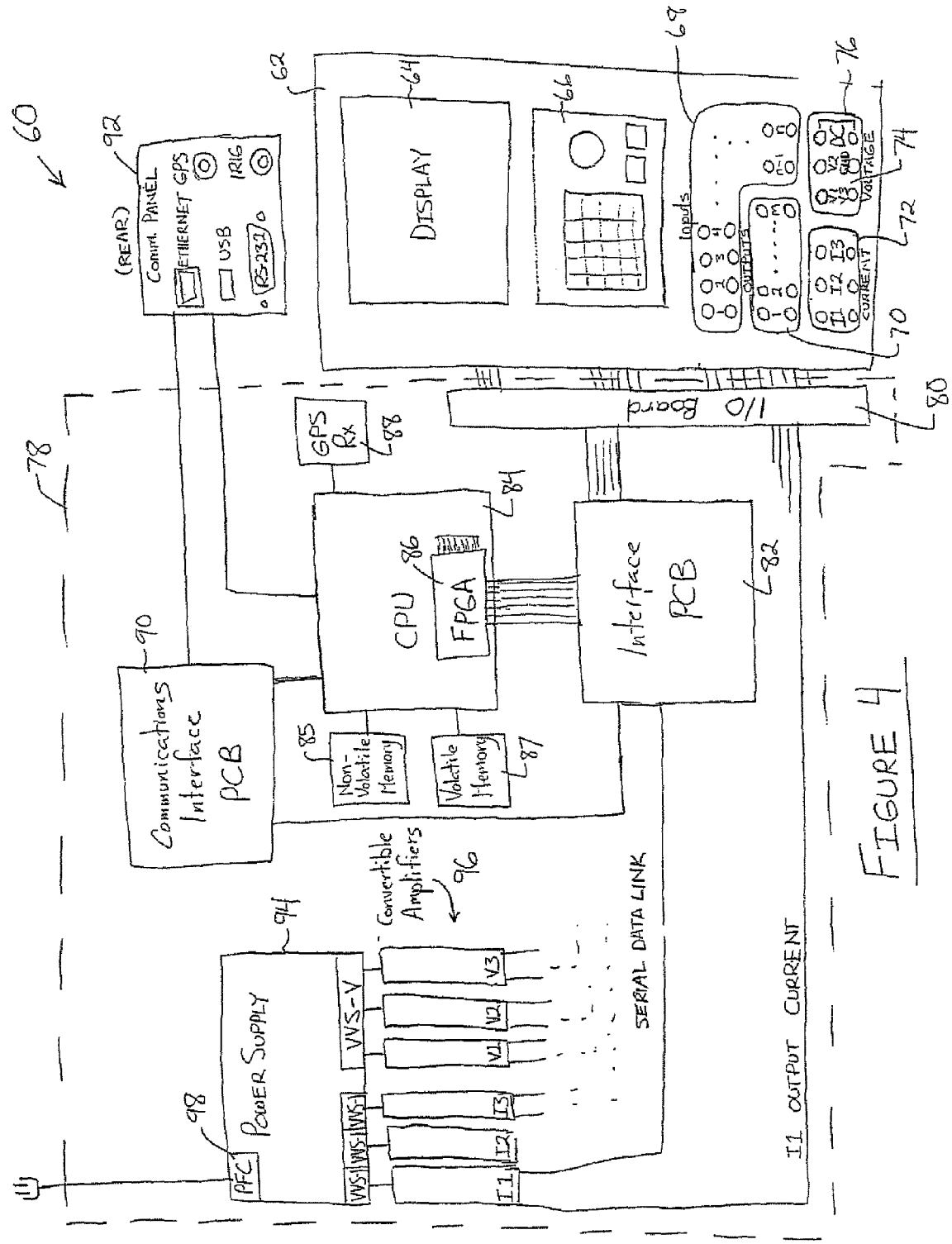
FIG. 4 is a schematic block diagram of a protective relay test system.

The tester 60 is shown in greater detail in FIG. 4. The tester 60 is housed in a structural casing or box, the front panel of which is shown in FIG. 4 and denoted by numeral 62. The front panel 62 of the box provides, for the user, a display 64 for displaying textual and graphical interfaces. The display 64 is preferably a liquid crystal display (LCD) and may itself provide an input mechanism by being a touch-screen (not shown). In the example shown in FIG. 4, the tester 60 comprises an input panel 66 which may comprise any number of and/or combination of input mechanisms such as a keypad, scroll wheel, trackball, rotary knob, push buttons, arrow keys, touch screen etc. The input panel 66 enables the user, in conjunction with the display 62, to interact with the tester 60, provide commands, give feedback, receive feedback etc.

The front panel 62 also provides n status inputs 68, e.g. n=12, for measuring various signals during the fault test; and m output contacts 70, e.g. m=4, for outputting various signals to simulate events that would be seen by the relay 18 in an actual fault. An example would be feedback indicating whether or not the breaker is open or closed. In this example, the tester 60 performs fault testing on a 3 phase transmission line 12 and thus the front panel 62 also comprises 3 AC current outputs 72, and 3 AC voltage outputs 74. The front panel 62 further comprises a DC voltage output 76 for powering the relay under test 18 or for providing voltage to the output contacts 70 for powering other devices.

The tester 60 houses various electronic components, shown within the dashed lines in FIG. 4. An input/output (I/O) board 80 provides a bridge between the inputs 68, outputs 70-76, input panel 66 and display 64, on the front panel 62, and an interface printed circuit board (PCB) 82. The interface PCB 82 is used to translate external connections to internal connections and routes the signals to the appropriate locations. Central to the operation of the tester 60 is a central processing unit (CPU) 84, which includes a field programmable gate array (FPGA) 86 connected thereto. The CPU 84 and FPGA 86 communicate with the interface PCB 82 for interacting with inputs and outputs; a GPS receiver 88 for receiving accurate time signals for end to end testing routines; and a communications interface PCB 90 and external communications panel 92, for uploading and downloading data and communicating with various media. As shown in FIG. 4, the communication panel may be compatible with various communication standards, such as Ethernet, universal serial bus (USB), GPS, RS-232 (serial) and Inter-Range Instrumentation Group (IRIG). The CPU 84 also has access to non-volatile memory 85 such as flash or a hard drive and to volatile memory 87 such as random access memory (RAM).

The tester 60 also includes a variable voltage power supply 94, which connects to an external power source through a power factor correction (PFC) circuit 98. The power supply 94 powers a series of convertible amplifiers 96. In this example, the tester 60 comprises three current amplifiers (I1, I2 and I3), and three voltage amplifiers (V1, V2 and V3). As shown for I1, each amplifier has a serial data link to the interface PCB 82 to obtain waveform data information, and provides an output to the appropriate contact on the front panel 62, through the I/O board 80.

It is generally desirable in a testing system such as those using the tester 60, to modulate the power supply 94 to decrease losses in the amplifiers 64. Previous modulation schemes have used either a class G arrangement (linear), or a class D arrangement (switched mode). In a class G amplifier, "rail switching" is used to decrease power consumption and increase efficiency. The class G amplifier has several power rails at different voltages, and switches between rails as the signal output approaches each. Thus the amplifier increases efficiency by reducing the "wasted" power at the output transistors. Despite the rail switching used, class G amplifiers still tend to dissipate a significant amount of power and are often relatively large in size as they require heat sinks to dissipate the resultant heat. Where high power amplifiers such as the amplifiers 94 are used in relay testing, this can be exacerbated. In a class D amplifier, although the power dissipation may be lower when compared to class G, noise can be a problem, which is generally undesirable. There are two problems with noise, namely the overall noise itself that can naturally be problematic, and consequently, such noise makes it more difficult to provide accurate measurements at lower output levels.

It has been recognized that a low dissipation rate, lower overall weight for the tester, and manageable noise can be achieved by modulating the power supply 94 using a class H arrangement. In a class H arrangement, the idea of Class G efficiencies are taken one step further creating an infinite number of supply rails. This is done by modulating the supply rails in the power supply 94 so that the rails are only a few volts larger than the output signal at any given time such that less power is wasted without clipping the signal. The output stage operates near its maximum efficiency all of the time. The variable voltage switched (VVS) power supply 94 shown in FIG. 4 is used to create the tracking rails. It has been found that significant gains may be achieved while avoiding the drawbacks of class G and class D arrangements.

Figure 5:
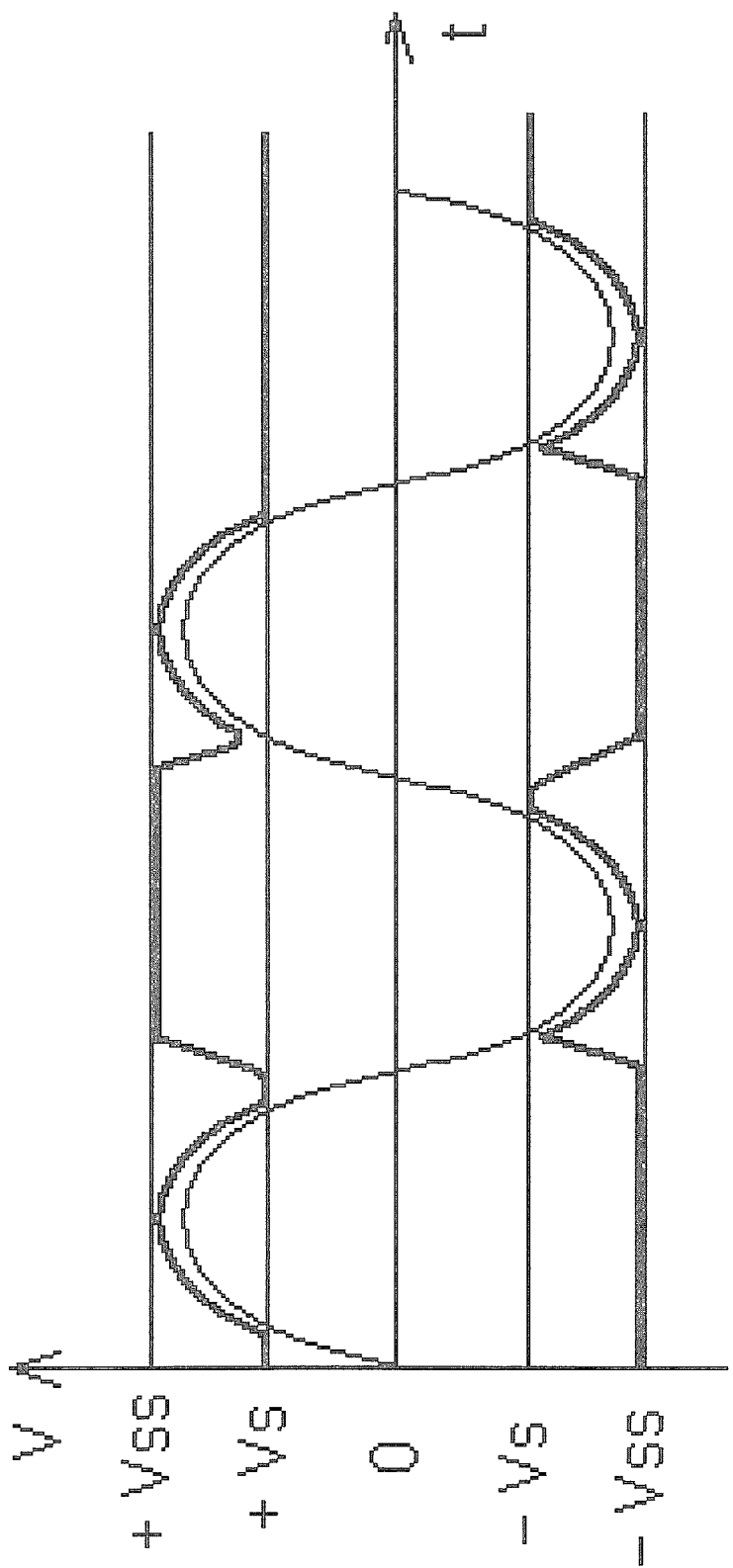
FIG. 5 is a waveform illustrating a class H modulation scheme for a variable voltage power supply.

FIG. 5 shows an implementation of class H, which is substantially similar to the ideal waveform in standard class H. In the implementation shown, the non-loaded power supply rail approaches full output during the non-output portion of the waveform. This modulation scheme simplifies the power supply 94 and has been found to have only a negligible effect on efficiency, since the output field-effect transistor (FET) connected to the "high" rail (see FIGS. 6 and 7 explained below) is biased off during this period.

Figure 6:
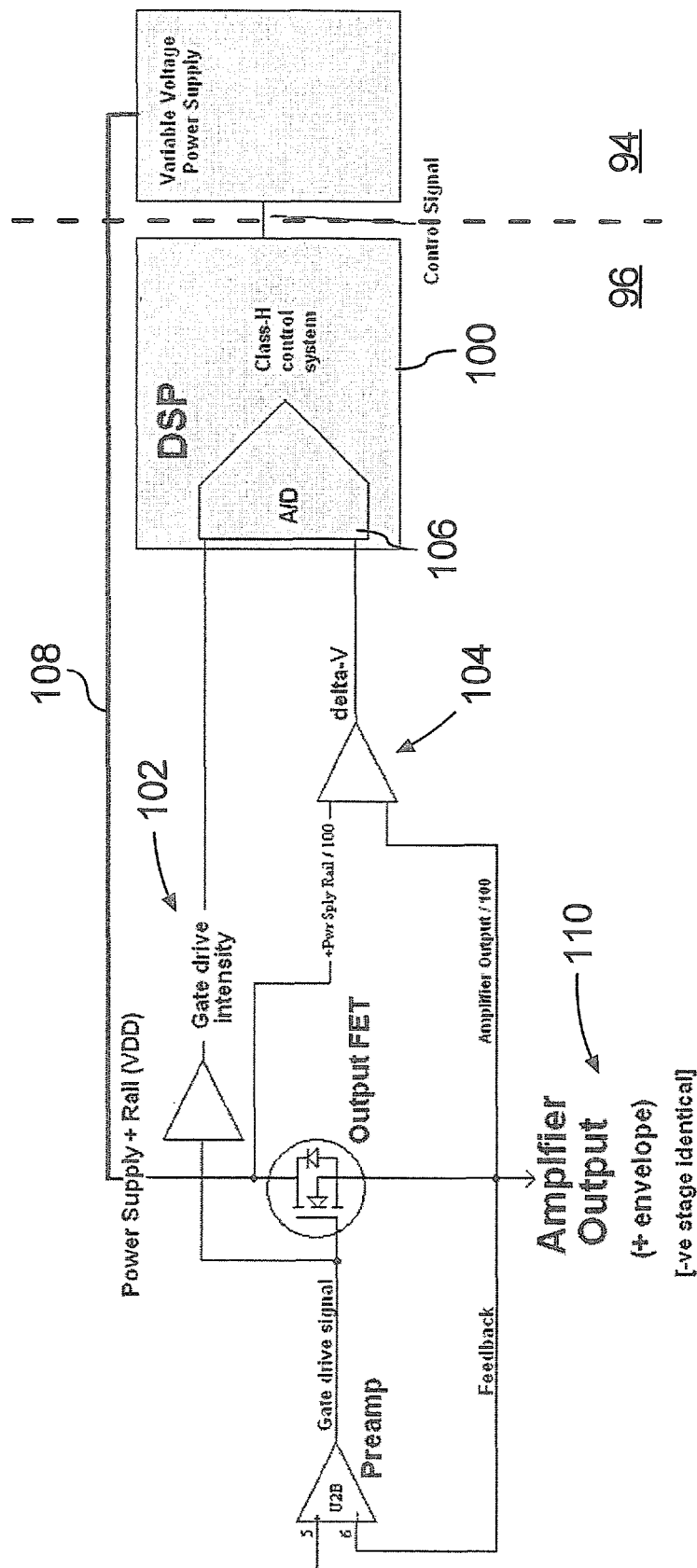
FIG. 6 is a schematic block diagram of a portion of an amplifier for implementing class H.
Figure 7:
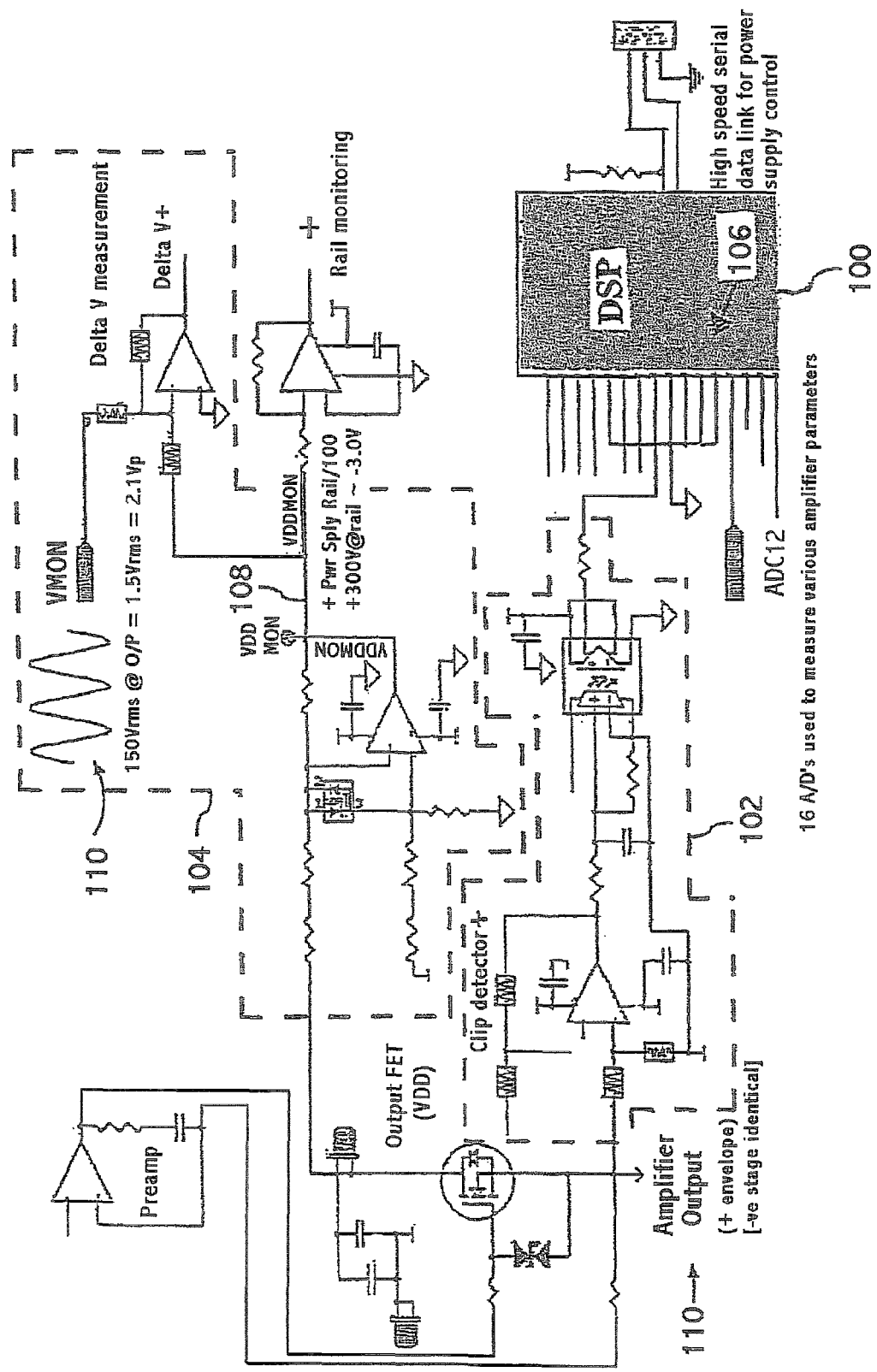
FIG. 7 is an electrical schematic for implementing the block diagram shown in FIG. 6.

To implement class H to behave as shown in FIG. 5, the amplifiers 96 can be constructed as shown in general terms in FIG. 6. Typical implementations of class H are analog, which in this example would not provide adequate separation between the amplifier 96 and the power supply 94. In order to provide such separation along with several other benefits discussed below, a digital signal processor (DSP) 100, dealing with digital quantities, is used as a control system for implementing the class H scheme. The DSP 100 measures and analyzes numerous signals within the amplifier to determine the optimum drive signal required to drive the programmable power supply 94 in class H operation. Although the reaction time of a DSP 100 may be relatively slower than some analog solutions, the DSP 100 provides a suitable compromise due to its inherent programmability (and resultant intelligence) and by realizing efficiencies in the programmed algorithms used to modify the output. In this way, the DSP 100 is able to at least partially predict where the output is going. Moreover, the DSP 100 is flexible in that various algorithms can be programmed into the software and subsequently changed or updated. Two circuit portions that are important in implementing class H operation when using the DSP 100, are a gate drive sense circuit 102 and a delta-V measurement circuit 104. Implementations of circuits 102 and 104 are shown by way of example only in FIG. 7.

The gate drive sense circuit 102, which in this embodiment comprises components U1a, R1, C19, R18, U8, R22, and the DSP 100, provides a gate drive intensity signal to the DSP 100 that is required to control the power supply 94 for class-H operation. The gate drive intensity signal tells the DSP 100 the extent to which the FET is being driven so that it knows how to increase or decrease the operation of the FET to achieve the desired output. This enables the DSP 100 to know and control how close the circuit is to the waveform without clipping the waveform. U1a is configured as a standard differential amplifier with unity gain. U8 is an isolated linear current sensing IC. The U1a with U8 sub-circuit scales the Q3 gate drive signal to an appropriate level for the analog to digital converters 106 on the DSP 100. U8 is used because the differential voltage between the DSP 100 and FET output circuit can range from a few volts to several hundred volts depending on the instantaneous rail voltage.

The delta-V measurement circuit 104, which in this embodiment comprises components U3, U31b, and the DSP 100, provides a signal proportional to the difference between the power supply rail 108 and the amplifier output 110. As can be seen best in FIG. 7, VMON is a scaled down representation of the amplifier output voltage 10, and VDDMON is a scaled down representation of the power supply positive rail voltage 108. In this embodiment, U31b is configured as an adder with an output voltage proportional to the difference between the rail and amplifier output.

It can therefore be seen that using class H operation with the amplifiers 96 can reduce power dissipation (with the possibility of decreasing overall weight by requiring fewer or smaller heat sinks) and decrease noise. Prior relay test sets have not realized that class H is particularly suitable in the environment discussed above. As noted, the use of class H provides a compromise between linear (class D) and switch mode (class G) solutions by providing a lower power solution than class G and lower noise than class D. Moreover, the use of a DSP 100 provides separation between the amplifier 96 and the power supply 94 as well as offering the flexibility in being able to program algorithms that can realize efficiencies in achieving the desired output. Since the output levels for relay testing are generally high, a lower power solution is an advantage in that it can minimize overloading on the power supply line to the test set when the tester 60 is used in end-to-end testing as discussed below. Further, the lower power solution dissipates less heat, and thus the heat sinks needed can be reduced in size and/or number. The lower noise is beneficial in that the noise floor is reduced as well as enabling a more accurate measurement at lower output levels. Moreover, the class H arrangement described herein is particularly suitable in this environment as the duration of high power tests, to which a lower power solution is beneficial, is specific to electromechanical relays such as those being tested by the tester 60. The combination of using class H and the control thereof using the DSP 100 also enables the output to follow as close as possible to the output rails without clipping the waveform.

As discussed above, the complexity of power system protection systems used to safeguard power systems has grown such that many modern power system protections use testing equipment (e.g. tester 60) that are synchronized via GPS satellites to properly perform the test, e.g. using timing signals. Power system end to end testing involves coordinated simultaneous synthesis and generation of predetermined fault case(s) at various locations. When performing this type of test, the response from the relay 18, 20 and auxiliary equipment (e.g. CT 22) is dependent on both the nature of the fault being simulated, and the response from the remote equipment. Therefore, it may be necessary to generate numerous fault scenarios simultaneously at all ends of the line 12 to verify the correct operation of the protection scheme.

The actual test typically takes only a fraction of a second, however, as also discussed above, the preparation and subsequent analysis can be very time consuming and may even require several days. Proper analysis of the test results should be performed by an expert or experienced professional and such analysis can consume a significant portion of their time.

Figures 8, 9:
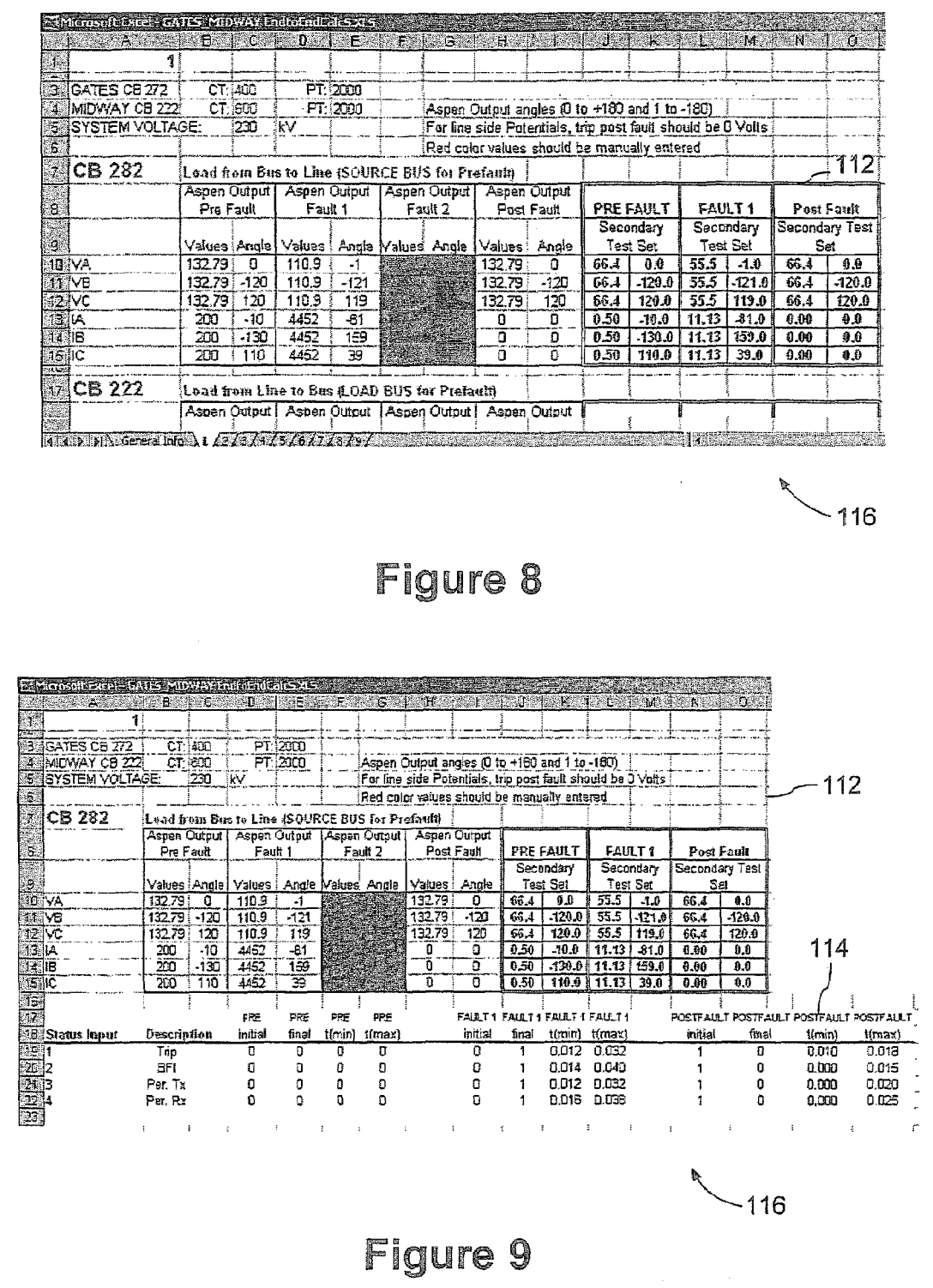

It has been recognized that using the hardware and software capabilities already included in the tester 60, the results and analysis can be realized in mere seconds and can be done instantaneously following a fault simulation. FIG. 8 shows an example of a test file 116, which specifies a fault case 112 that has been prepared by a professional ahead of the actual fault simulation. It has been realized that the preparation of the test file 116 can be extended to include pre-programmed, expected results 114 so that this knowledge is known ahead of time, and can then be used to analyze a test case 112. As such, the expected results 114 can be used to generate instantaneous test reports and graphical "pass/fail" outputs by comparing test results with expected results 114 and applying predefined analytical operations. In this way, every time a test case is run, the predefined expected results can be used to perform an instantaneous analysis and avoid having to manually interpret the resultant test data, which can be time consuming and may be prone to human error. Moreover, by having the appropriate professional define the expected results beforehand, a technician who is inexperienced in the analysis can still obtain the results and convey those back to the professional.

FIG. 9 illustrates a modified version of the spreadsheet shown in FIG. 8 with expected result data 114 in the lower portion. It will be appreciated that the result data 114 may be added to an existing test case 112 (e.g. FIG. 8) or can be prepared by an experienced professional at the same time as preparing the test file 116. The number of test points being monitored is entirely up to the professional designing the test and an additional row in the spreadsheet can be added to add an additional test point as desired. Descriptive information may be included in the fault case, which can then be loaded automatically into the test report to provide more meaningful information.

It will be appreciated that the example shown in FIG. 9 is for illustrative purposes only and that any type of test file 116 can be created and used to run fault test data 112 and generate reports. Other formats such as a text file, database file, XML, etc. may used to create the test file 116. By creating expected result data 114, and including it with the fault case 112 as shown in FIG. 9, the time consuming task of determining the expected results 114 only needs to be performed once, by the appropriate professional, is properly documented and/or standardized in the test file 116, and may be verified instantaneously by the test equipment every time the test is performed.

Figure 10:
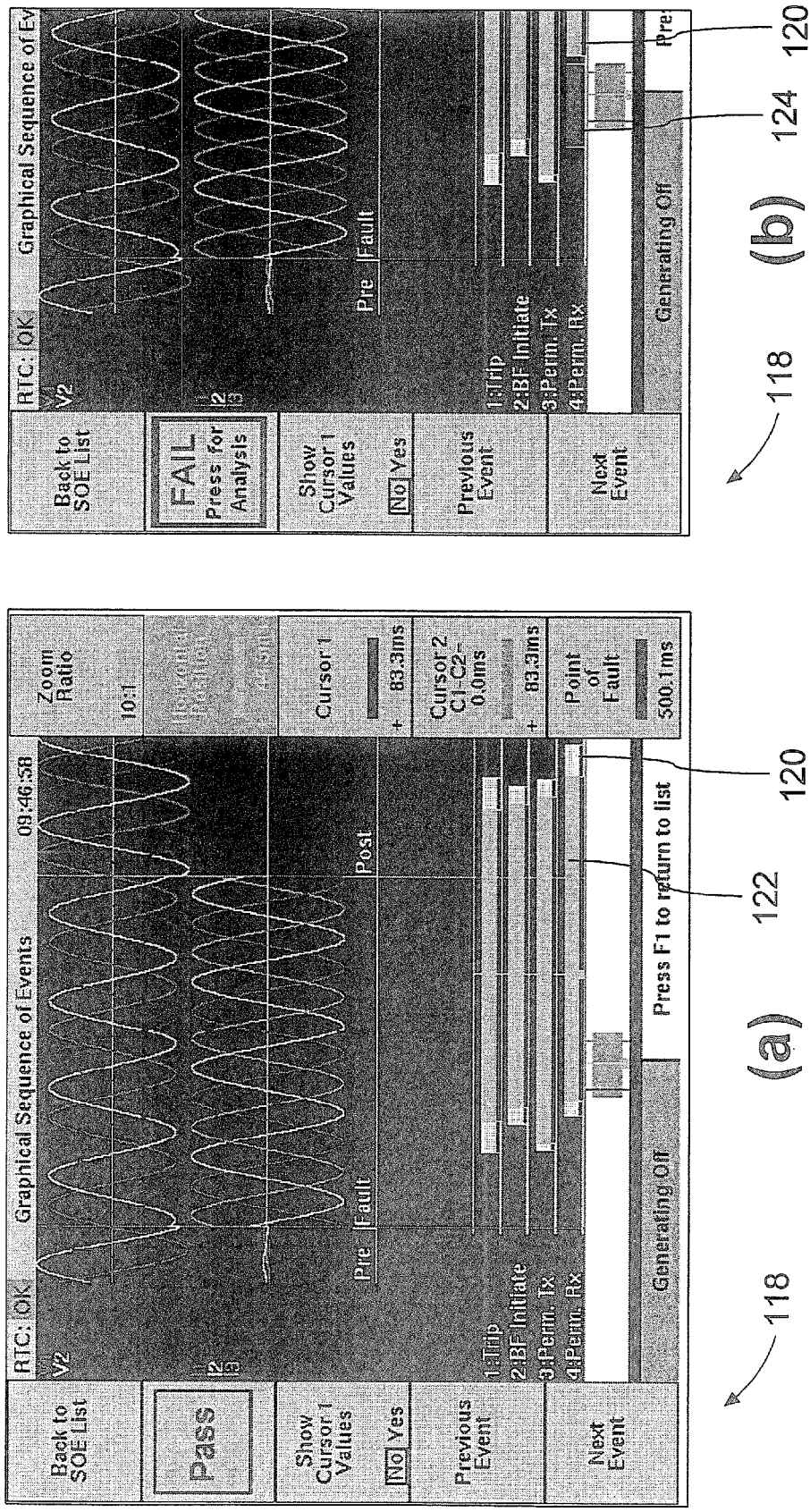
FIG. 10 provides a screen shot of a test result report for a passed fault test in view (a) and for a failed fault test in view (b) according to the test data defined in the spreadsheet of FIG. 9.
Figure 11:
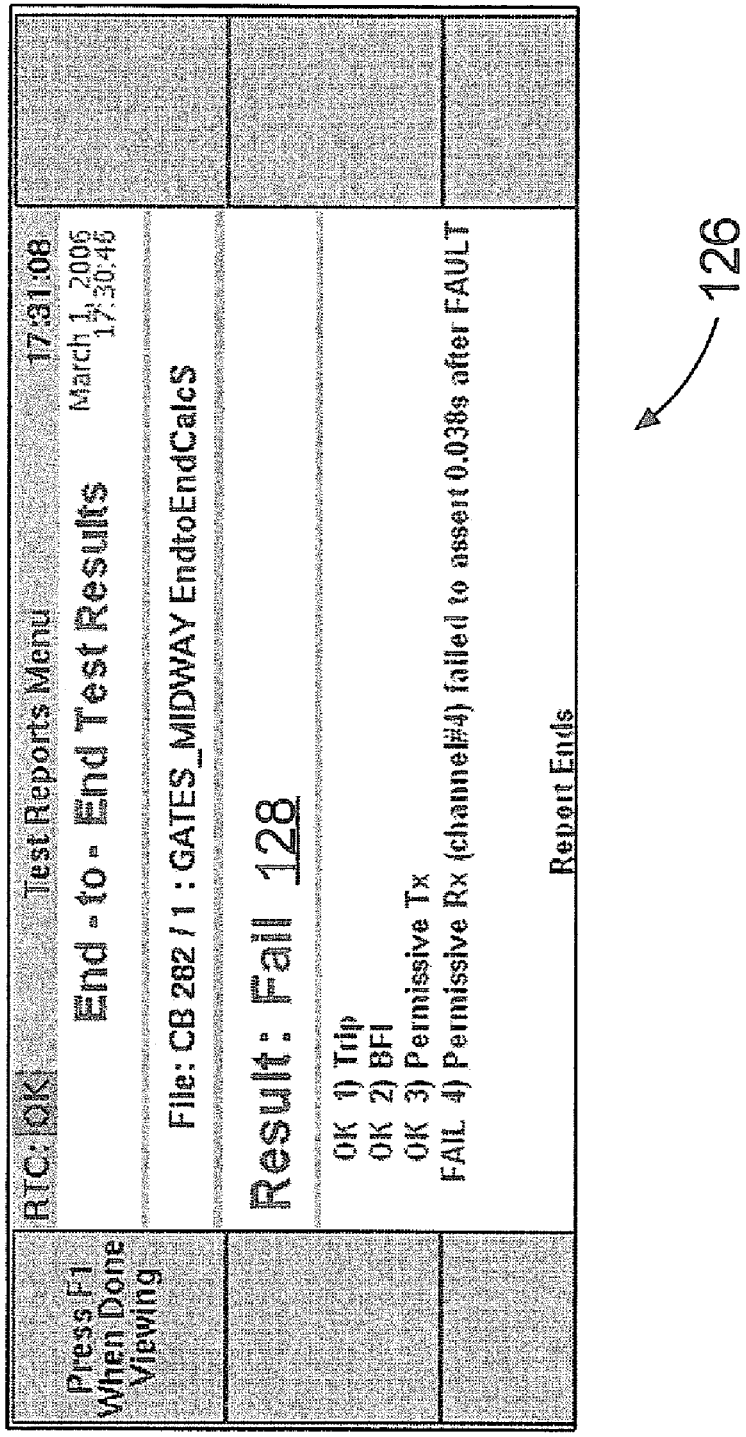
FIG. 11 is a screen shot of a test report menu for a fault test operated according to the test data defined in the spreadsheet of FIG. 9.

The test result analysis is in one embodiment performed by the CPU 84. The test files 116 are typically stored in memory, either the non-volatile memory 85 (hard drive or flash) or the volatile memory 87 (RAM), and accessed and run by the CPU 84 upon receiving an appropriate input from the user at the input panel 66. The fault test may then be performed by the tester 60 and the results compared to the expected results 114 stored in the test file 116. An analysis module stored preferably in a software program operated by the CPU 84 may then create an output for displaying the results of the test as shown in FIGS. 10 and 11. In order to prepare a test, the user would prepare a test case and save it into non-volatile memory 85 within the tester 60. In order to subsequently run the test, the user would transfer the test case into volatile memory 87, run the test on the tester 60, and review reports and/or display the results graphically.

FIG. 11 illustrates a test report menu 126 which provides an overview of the results for the test case shown in FIG. 10 (b). As can be seen in FIG. 11, each test point is clearly identified and an "OK" or "FAIL" identifier included to show where the failure occurred. An overall test result 128 may also be provided. The report menu 126 enables the user to first review/save/print the results and provides an option for displaying the results graphically.

As can be seen in FIG. 10, a graphical user interface 118 is provided that can be displayed on the display 64 upon competing a fault test. The interface 118 comprises graphical waveforms to illustrate voltage and current in pre-fault, fault and post-fault stages. Below the waveforms, a graphical bar 120 is provided for each test point. The darker portions 122 of the bars shown in view (a) indicate that the expected result for the particular test point occurred within the acceptable range, which is represented by the lighter colour. In this way, the user can immediately and visually, identify when and what went wrong, should the test fail. View (b) in FIG. 10 shows such a failure where it is clear that test point 4 did not occur within the acceptable time range. In this case, it can be seen that the occurrence of the test point, shown as a darkened bar 124, was outside (before) the graphical bar 120 Along each side of the display 64, a number of options such as zoom ratio may be provided to adjust settings and manipulate and explore the output graphically. Since the test case is preloaded with the expected results, the graphical display can not only show what happened during the test, it can also, by way of the bars 122, 124 show the user how far away they were from what should have happened. This can, e.g., enable an inexperienced user to easily determine what went wrong so that they can report this to the more experienced professional without requiring analysis to do so. This can save time and reduce errors in interpreting the data. In other words, the expected results can be intelligently used so that the actual results are more meaningful.

Testing equipment such as tester 60 may be used for manual tests in addition to end-to-end testing. Manual testing involves a single tester 60 running a series of test cases on a particular piece of equipment in the power system, such as a protective relay 10.

Protective relay test instruments, e.g. tester 60, generate waveforms using a set of voltage and current waveform generators (e.g. amplifiers 96). These waveforms are typically connected to the voltage and current inputs of a protective relay (at switches 34 and 38, see FIG. 3), or similar equipment. The outputs of the equipment under test are typically connected to digital inputs on the instrument (e.g. through switch 36), and digital outputs on the instrument are used to control aspects of the operation of the equipment under test.

A common requirement for such an instrument is the ability to measure timing relationships. For example, the instrument might generated a high level of current, interpreted by an overcurrent relay as a fault condition. The instrument would monitor the "trip" output of the overcurrent relay, and measure the time between the start of the high-current waveform and the closure of the trip output (typically known as the relay's "operate time"). A typical fault scenario contains many events that occur very quickly (e.g. within milliseconds) making it difficult if not impossible for the naked eye to follow the sequence of events. Traditionally, the data captured during a test is recorded and then used for later analysis.

Figure 12:
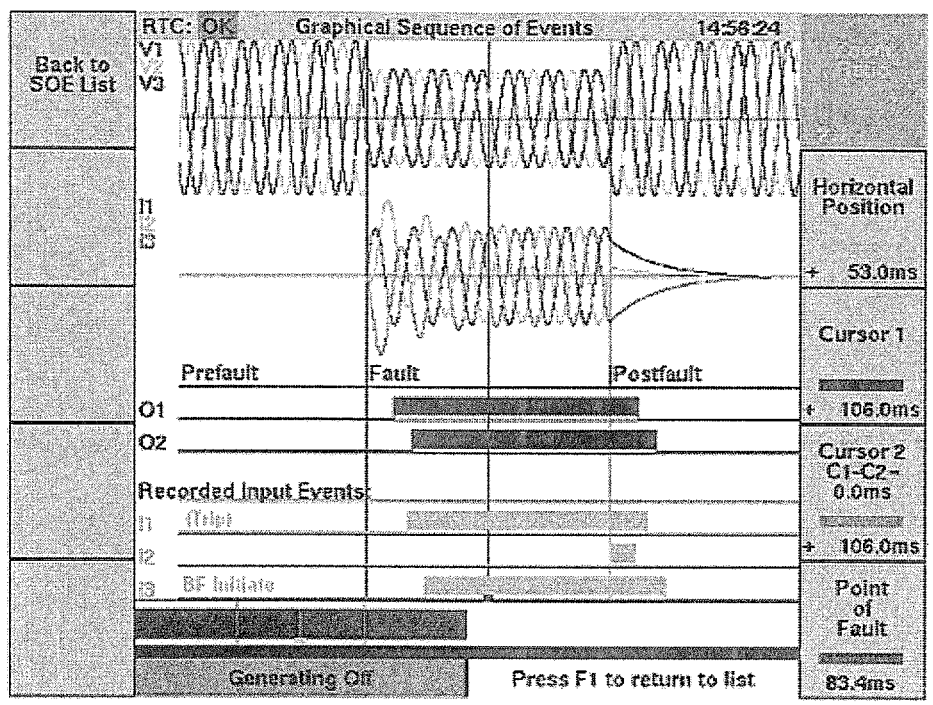
FIG. 12 is a screen shot of a graphical sequence of events displayed for manual fault test data.

The test result data can used at run time to provide meaningful displays for the user. This can be accomplished by capturing the sequence of events data and converting it into a useable, graphical form so that the user can evaluate the various operations, as shown in FIG. 12. The tester 60 uses a concept that may be referred to as "fault states", where each fault state defines a set of generation parameters (current and voltage magnitudes, phase angles, frequencies, etc.) and rules for making transitions to other states. The active fault state may change due to user-initiated commands, digital input changes or the expiration of a timer.

To understand the test results, users of the tester may need to see the actual generated waveforms, along with state changes of digital inputs, digital outputs and fault states. That way, analysis of the results can include, for example, waveform phase angle information. One way of obtaining the required waveform data is to connect a measuring and recording instrument (not shown). However, that approach requires the user to obtain and connect at least two instruments for the test.

The sequence of events recorder described herein allows such analysis to be performed without requiring external recording equipment or computers, so the user only needs one instrument, e.g. the tester 60. In this way, the capabilities already provided by the tester 60 such as display 64 and processing capabilities can be harnessed to provide meaningful output for the user.

As discussed and shown in FIG. 4, the tester 60 has numerous status inputs 68 that are used to monitor the status points of interest. The user can assign relevant names to the various input points to clarify the graphical sequence of events diagram as shown in the screen shot of FIG. 13. The sequence of events record is configured such that the user does not have to setup any parameters to use this feature, all relevant data is captured automatically when ever a test is executed. The sequence of events record is preferably stored in volatile memory 87 and displayed upon selection by the user.

Whenever the tester 60 generates output waveforms, it may record every sample of the generated waveform in volatile memory 87. A software setting determines whether these samples represent the programmed levels or currents and voltages measured at the outputs using analog-to-digital converters. The buffer also stores the states of all the digital inputs and outputs, as well as the active fault state. The data capture operation continues until the end of the test shot (i.e. a short time after the instrument stops generating waveforms), or when the buffer becomes full, whichever occurs first. The buffer should be large enough to capture data for a typical protective relay test (30 seconds, for example).

Once the test is complete, a selection option can be presented to the user that allows the user to display a list of all the recorded events, in chronological order, with enough timing information to allow analysis of the sequence as shown in FIG. 12. Another selection option can be used to cause the tester 60 to display the sequence information and waveform data graphically on display 64. As can be seen in FIG. 12, waveforms and digital input/output states are shown in an oscilloscope-like fashion on an X-Y plot where the horizontal axis is time and the vertical axis for each trace is magnitude or state. Waveforms are grouped as appropriate to the test. For example, all three voltages in a three-phase set may be superimposed on each other. The waveform traces may be shown in different colors so they can be differentiated while superimposed.

The graphical display also shows the active fault state by drawing a box illustrating the time during which each state was active. Each box is labeled with the name of the fault state. The fault state name is abbreviated if the width of the box is too small to show the entire fault state name. Controls are provided to control the information display, as described below.

A "zoom" button allows the user to zoom the time scale in or out using a rotary knob on the instrument. A "horizontal position" button allows the user to pan back and forth along the time line using, e.g., a rotary knob. A box at the bottom of the screen, graphically illustrates which portion of the time scale is being shown in the main graphics area, based on the zoom and horizontal position settings.

Preferably, buttons are provided for "cursor 1", "cursor 2" and "point of fault", which allows the user to move the associated cursor lines back and forth using a rotary knob. The time is displayed for each cursor and for the horizontal position, relative to the point of fault. The time of the point of fault is shown relative to the start of the captured data buffer. The difference between the cursor 1 and cursor 2 positions is shown, allowing the user to make relative time calculations. A button is also provided to show the instantaneous waveform voltage and current levels at the "cursor 1" position, so that the user can move cursor 1 back and forth to make waveform measurements.

Buttons may be provided for "next event" and "previous event" when adjusting the horizontal position, point of fault, or a cursor. These keys may move to the next or previous time, relative to the present setting of the cursor or position, at which an event occurred. The event may be, for example, a change of active fault state, or a transition of a digital input.

Figure 13:
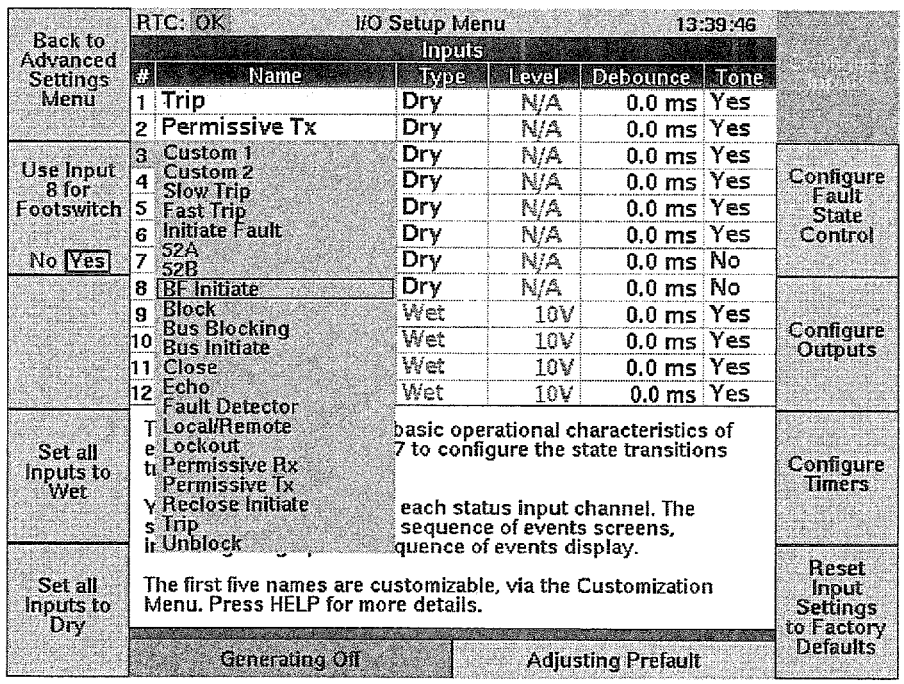
FIG. 13 is a screen shot of an input/output (I/O) set up menu for the sequence of events display.

As shown in detail in FIG. 13, the various test points may be configured in a setup menu 170, e.g. to name the test point for ease of reference. The fault state control, outputs, timers and input settings should be configurable by providing suitable option buttons as shown in FIG. 13.

It can therefore be seen that the data recorded during a manual equipment test can be captured and displayed in a usable form on the tester 60 to provide instantaneous results for the user in the field. In this way, data which has previously been underutilized can be taken advantage of.

Although the invention has been described with reference to certain specific embodiments, various modifications thereof will be apparent to those skilled in the art without departing from the spirit and scope of the invention as outlined in the claims appended hereto.

The invention claimed is:

1. A system for modulating a power supply in a relay test system comprising an amplifier, said system comprising a control system separating said power supply and said amplifier and configured to operate according to a class H modulation scheme; an output switching mechanism connected to said control system; a drive intensity signal input into said control system indicative of the extent to which said output switching mechanism is being operated; and a voltage difference circuit for monitoring a difference between an output of said amplifier and a power supply rail; wherein said class H modulation scheme is operated according to readings taken from said voltage difference circuit and said drive intensity signal.

2. The system according to claim 1 wherein said control system comprises a digital signal processor.

3. The system according to claim 1 wherein said output switching mechanism is a transistor.

4. The system according to claim 3 wherein said output transistor is a field effect transistor (FET).

5. The system according to claim 2 wherein said digital signal processor comprises a pre-programmed algorithm to predict changes in said power supply rail.

6. The system according to claim 1 wherein said control system provides a control signal to said power supply for modulating said power supply according to said readings taken from said voltage difference circuit and said drive intensity signal.

7. A method of modulating a power supply in a relay test system comprising an amplifier, said method comprising:
 providing a control system to separate said power supply and said amplifier, said control system configured to operate according to a class H modulation scheme;
 providing an output switching mechanism connected to said control system; and
 during operation of said power supply:
  obtaining a drive intensity signal input indicative of the extent to which said output switching mechanism is being operated;
  monitoring a difference between an output of said amplifier and a power supply rail using a voltage difference circuit; and operating said class H modulation scheme according to readings taken from said voltage difference circuit and said drive intensity signal.

8. The method according to claim 7 wherein said control system comprises a digital signal processor.

9. The method according to claim 8 wherein said digital signal processor comprises a pre-programmed algorithm to predict changes in said power supply rail.

10. The method according to claim 7 wherein said output switching mechanism is a transistor.

11. The method according to claim 10 wherein said output transistor is a field effect transistor (FET).

12. The method according to claim 7 wherein said control system provides a control signal to said power supply for modulating said power supply according to said readings taken from said voltage difference circuit and said drive intensity signal.

* * * * *